[12] United States Patent
Sato

(10) Patent No.: US 8,023,291 B2
(45) Date of Patent: Sep. 20, 2011

(54) VOLTAGE DETECTING CIRCUIT AND SWITCHING POWER SOURCE APPARATUS

(75) Inventor: Takeshi Sato, Tama (JP)

(73) Assignee: Mitsumi Electric Co., Ltd., Tama (JP)

( * ) Notice: Subject to any disclaimer, the term of this patent is extended or adjusted under 35 U.S.C. 154(b) by 233 days.

(21) Appl. No.: 12/400,164

(22) Filed: Mar. 9, 2009

(65) Prior Publication Data

US 2009/0284995 A1    Nov. 19, 2009

(30) Foreign Application Priority Data

May 13, 2008 (JP) ................. 2008-125440

(51) Int. Cl.
H02M 3/335 (2006.01)
H02M 3/22 (2006.01)
(52) U.S. Cl. .............. 363/21.14; 363/76; 363/127
(58) Field of Classification Search .......... 363/21.06, 363/21.14, 76, 81, 89, 127
See application file for complete search history.

(56) References Cited

U.S. PATENT DOCUMENTS

| 6,049,471 | A  | * | 4/2000  | Korcharz et al. | ............... 363/20 |
| 6,490,178 | B1 | * | 12/2002 | Asayama | ............... 363/21.06 |
| 6,831,847 | B2 | * | 12/2004 | Perry | ............... 363/21.06 |
| 7,542,308 | B2 | * | 6/2009  | Yamada | ............... 363/21.01 |
| 7,542,309 | B2 | * | 6/2009  | Leung | ............... 363/21.06 |
| 7,751,213 | B2 | * | 7/2010  | Toccaceli | ............... 363/127 |

FOREIGN PATENT DOCUMENTS

JP    2004-129364 A    4/2004

* cited by examiner

Primary Examiner — Gary L Laxton
(74) Attorney, Agent, or Firm — Holtz, Holtz, Goodman & Chick, PC

(57) ABSTRACT

A voltage detecting circuit to perform voltage detection by introducing a voltage from a detection node, comprises: a first resistance, a second resistance, and a first switching element, connected in series with each other from the detection node to reference electric potential in order; and a detection circuit for performing a detection operation of a voltage by receiving input of the voltage from a node between the first resistance and the second resistance, wherein a control voltage generated on the basis of the voltage at the detection node is supplied to a control terminal of the first switching element, and the first switching element is turned on when the voltage at the detection node is large, and the first switching element is turned off when the voltage at the detection node is small.

12 Claims, 7 Drawing Sheets

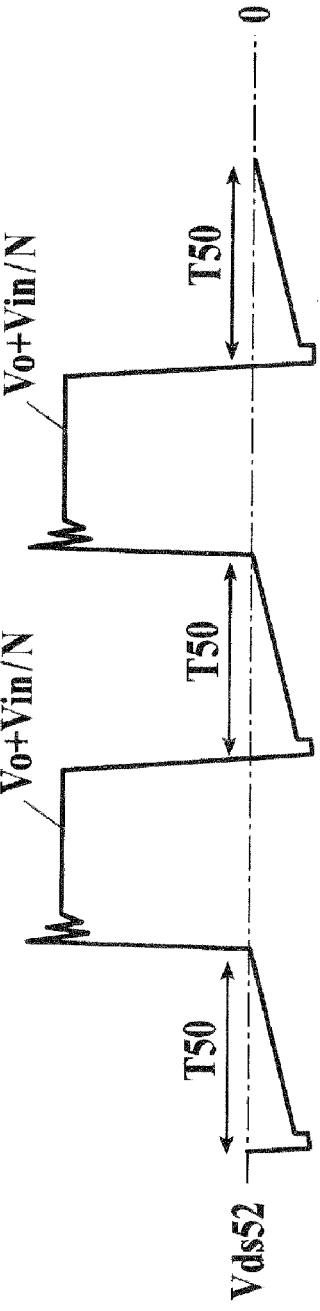
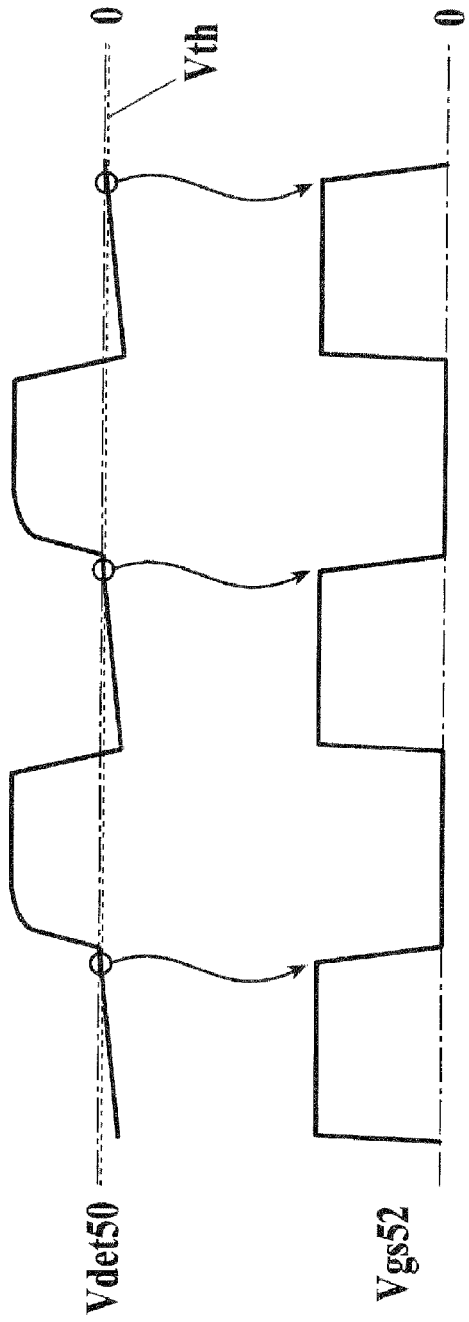
FIG. 7A
FIG. 7B
FIG. 7C

VOLTAGE DETECTING CIRCUIT AND SWITCHING POWER SOURCE APPARATUS

BACKGROUND OF THE INVENTION

1. Field of the Invention

The present invention relates to a voltage detecting circuit to perform voltage detection by introducing a voltage from a detection node, and to a switching power source apparatus to perform a control operation of a switching element on the basis of the voltage output of the voltage detecting circuit.

2. Related Art

As shown in FIG. 6, there is, for example, a flyback system switching power source apparatus (switching power source apparatus of flyback system) adopting the configuration of detecting a drain-to-source voltage Vds52 of a synchronously rectifying element SW52, made of a power MOS FET or the like, and of performing the on-off control of the synchronously rectifying element SW52 on the basis of the detected voltage Vds52.

In such a switching power source apparatus, as shown in a time chart of FIGS. 7A-7C, when the synchronously rectifying element SW52 is in its off-state (at the time of the low level of the gate voltage Vgs52), the voltage Vds52 at the drain terminal of the synchronously rectifying element SW52 becomes a high voltage composed of an output voltage Vo and an added voltage Vin/N, which is equal to the input voltage Vin divided by a turn ratio N.

Generally, the method of constituting a detection circuit 51 with high-voltage withstanding elements or the method of inputting a dropped voltage into the detection circuit 51 by the use of voltage dividing circuits R51 and R52, as shown in FIG. 6, or by the use of a pull down resistor to perform the voltage detection at a detection point to which the high voltage mentioned above is applied, is used in order to perform the detection.

Japanese Patent Application Laid-Open Publication No. 2004-129364 discloses the circuit to step down an output voltage with a voltage dividing circuit to input the stepped-down voltage into a shunt regulator for generating a reference voltage in order to detect the output voltage.

However, in the case where the voltage Vds52 at the detection node is introduced into the detection circuit 51 through the voltage dividing circuits R51 and R52 as shown in FIG. 6, a detection voltage Vdet50, which is a uniformly divided voltage of the voltage Vds52 from the high range thereof to the low range thereof as shown in FIGS. 7A and 7B, is input into the detection circuit 51 Consequently, in a period T50, in which the voltage Vds52 at the detection node is a low voltage and voltage changes are small, the detection voltage Vdet50, the voltage changes of which are made to be further smaller by the voltage division, is input into the detection circuit 51.

It is supposed here that the detection circuit 51 detects the timing at which the detection voltage Vdet50 reaches a pre-determined threshold voltage (for example, a voltage slightly lower than a voltage of zero) Vth in the period T50. In this case, since the voltage changes of the detection voltage Vdet50 become smaller by the voltage dividing circuits R51 and R52, the problem in which the detection accuracy of the timing falls is caused.

Moreover, parasitic capacitance Ca, such as the gate capacitance of a MOS FET, is generated at the input terminal of the detection circuit 51. Consequently, if the voltage dividing circuits R51 and R52 as shown in FIG. 6 exist, a time constant circuit is formed by the resistance R51 and the parasitic capacitance Ca, and consequently the problem of the generation of waveform rounding in the detection voltage Vdet50 by the passage of the voltage Vds52 at the detection node through the time constant circuit is caused. Furthermore, if the voltage drop quantity by the voltage dividing circuits R51 and R52 is made to be larger, then the resistance R51 on the side of the detection node must be the one having a large value. Consequently, even if the parasitic capacitance Ca is that of rather small, the time constant of the time constant circuit becomes a large value. Then, the problem in which, if the waveform rounding is caused in the detection voltage Vdet50, a delay is produced in the detection timing of a voltage is caused.

SUMMARY OF THE INVENTION

The present invention is directed to provide a voltage detecting circuit that does not need to make the detection element high-voltage withstanding one, and that does not fall the detection accuracy thereof, even if voltage detection is preformed at, for example, a detection point to which a voltage having a large potential difference is output.

The present invention is further directed to provide a switching power source apparatus realizing a highly accurate power source operation with the voltage detecting circuit mentioned above, and to enable highly efficient voltage output.

A first aspect of the present invention is characterized by providing a voltage detecting circuit to perform voltage detection by introducing a voltage from a detection node, comprising:

a first resistance, a second resistance, and a first switching element, connected in series with each other from the detection node to reference electric potential in order; and a detection circuit for performing a detection operation of a voltage by receiving input of the voltage from a node between the first resistance and the second resistance, wherein a control voltage generated on the basis of the voltage at the detection node is supplied to a control terminal of the first switching element, and the first switching element is turned on when the voltage at the detection node is large, and the first switching element is turned off when the voltage at the detection node is small.

A second aspect of the present invention is characterized by providing a switching power source apparatus of a flyback system, for outputting a voltage to a secondary winding side of a transformer by intermittently applying a voltage to the primary winding of the transformer, comprising:

a transformer including a primary winding and a secondary winding;

a synchronously rectifying element connected to the secondary winding; and a voltage detecting circuit according to any one of the first aspect, the voltage detecting circuit performing voltage detection at a connection node between the secondary winding and the synchronously rectifying element, wherein an operation control of the synchronously rectifying element is performed on the basis of a detected output of the voltage detecting circuit.

A third aspect of the present invention is characterized by providing a switching power source apparatus, comprising:

a reactor to accumulate electric power;

a switching element for intermittently applying an input voltage to the reactor;

a synchronously rectifying element for supplying an electric current to the reactor when the switching element is in its offstate; and a voltage detecting circuit according to any one of the first aspect, the voltage detecting circuit performing voltage detection at a connection node of the synchronously rectifying element and the reactor, wherein an operation control of the synchronously rectifying element is performed on the basis of a detected output of the voltage detecting circuit.

BRIEF DESCRIPTION OF THE DRAWINGS

The above and other objects, advantages and features of the present invention will become more fully understood from the detailed description given below and the appended drawings, and the following descriptions pertain to the embodiment of the present invention are not intended to limit the present invention, and wherein:

FIGS. 7A, 7B, and 7C are waveform diagrams showing voltage changes at each of the nodes of the circuit of FIG. 6.

DETAILED DESCRIPTION OF THE PREFERRED EMBODIMENTS

In the following, the preferred embodiments of the present invention will be described with reference to the attached drawings.

First Embodiment

Figure 1:
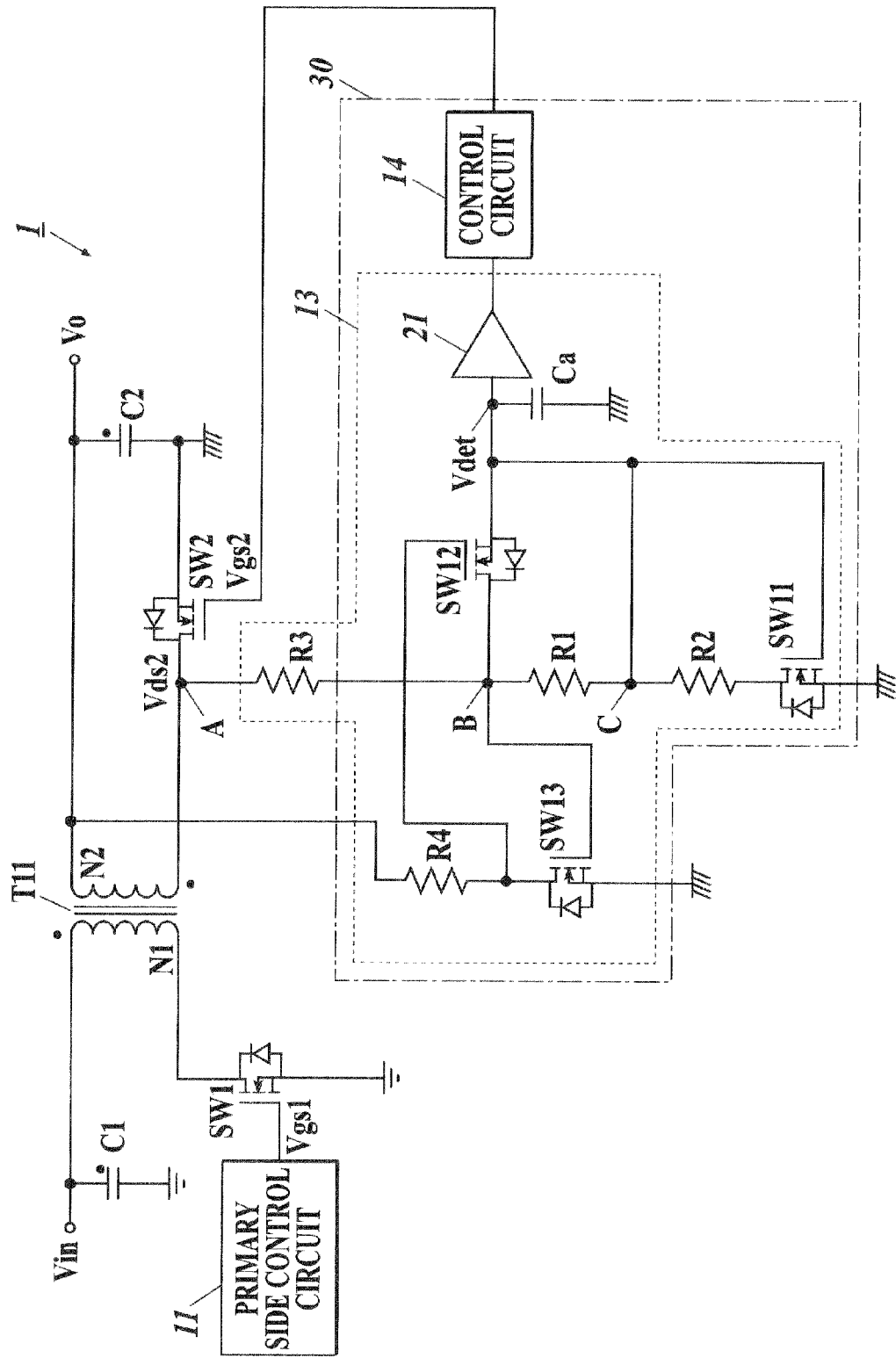
FIG. 1 is a configuration diagram of a switching power source apparatus according to a first embodiment of the present invention.

FIG. 1 is a configuration diagram of a switching power source apparatus of a first embodiment of the present invention.

The switching power source apparatus 1 of the first embodiment is a flyback system power source apparatus including a transformer T11, a switching element (for example, N channel power MOS FET) SW1, a primary side control circuit 11, a smoothing capacitor C1, a synchronously rectifying element (for example, N channel power MOS FET) SW2, a smoothing capacitor C2, a voltage detecting circuit 13, a control circuit 14, and the like. The transformer T11 includes a primary winding N1 and a secondary winding N2, which has a polarity inverted to that of the primary winding N1. The switching element SW1 intermittently applies an input voltage Vin to the primary winding N1. The primary side control circuit 11 performs the on-off control of the switching element SW1. The smoothing capacitor C1 smoothes the input voltage Vin. The synchronously rectifying element SW2 rectifies the current flowing through the secondary winding N2. The smoothing capacitor C2 performs the smoothing of the output voltage Vo. The voltage detecting circuit 13 introduces the drain voltage (drain-to-source voltage) Vds2 of the synchronously rectifying element SW2 to detect that the drain voltage Vds2 becomes a predetermined voltage. The control circuit 14 performs the on-off control of the synchronously rectifying element SW2 on the basis of the detected output of the voltage detecting circuit 13. The voltage detecting circuit 13 (except for the external resistance R3) and the control circuit 14 among the above-mentioned components are integrated into a controlling IC 30.

The primary side control circuit 11 performs the on-off control of the switching element SW1 so that the output voltage Vo may be stabilized by detecting the output voltage Vo through, for example, a photo coupler, or by providing an auxiliary winding to the transformer T11 to detect the output voltage Vo on the basis of the voltage of the auxiliary winding, although the photo coupler and the auxiliary winding are omitted to be shown. The control method on the primary side is not especially limited, and for example, the control method may be an externally excited pulse width modulation method, an externally excited pulse frequency modulation method, or a self-excited control method.

The synchronously rectifying element SW2 limits the electric current flowing through the secondary winding N2 into one direction, and is turned off to stop the electric current of the secondary winding N2 in, for example, a period in which the switching element SW1 on the primary side is turned on to accumulate energy into the core of the transformer T11. Moreover, the synchronously rectifying element SW2 flows an electric current into the rectification direction by being turned on or through a body diode in a period in which the switching element SW1 on the primary side is off. The turning-on of the synchronously rectifying element SW2 at the time of rectification can decrease the power loss of the rectifying element SW2 to achieve the increase of efficiency of the voltage conversion by the switching power source apparatus 1.

The control circuit 14 on the secondary side judges the on-timing of the switching element SW1 on the primary side and the off-state of the switching element SW1 on the basis of the drain voltage Vds2 of the synchronously rectifying element SW2, and the control circuit 14 sets the gate voltage Vgs2 of the synchronously rectifying element SW2 to the high level to perform an on-drive or returns to the low level to turn off the synchronously rectifying element SW2 on the basis of the judgment. In this embodiment, for example, if the drain voltage Vds2 exceeds a threshold voltage Vth, which is set to be slightly lower than "0 V," then the synchronously rectifying element SW2 is turned off, and if the drain voltage Vds2 becomes lower than the threshold voltage Vth, then the synchronously rectifying element SW2 is turned on. Incidentally, the threshold value Vth for turning on and off the synchronously rectifying element SW2 is not limited to the value mentioned above. Moreover, in place of performing both of the on-control and off-control of the synchronously rectifying element SW2 on the basis of the detection of the drain voltage Vds2, only the on-control of the synchronously rectifying element SW2 may be executed by the detection of the drain voltage Vds2, and the off-control thereof may be performed on the basis of the detection of another signal.

The voltage detecting circuit 13 includes a first resistance R1, a second resistance R2, a first switch (for example, N channel MOS FET) SW11, and a detection circuit 21. The first resistance R1, the second resistance R2, and the first switch SW11 are serially connected in order between a detection node A, to which the drain terminal of the synchronously rectifying element SW2 is connected, and reference electric potential (for example, the ground potential). The detection circuit 21 receives the input of a detection voltage Vdet to perform the detection operation of the detection voltage Vdet. The input terminal of the detection circuit 21 is connected to the node C of the first resistance R1 and the second resistance R2.

The voltage detecting circuit 13 further includes a third resistance R3, a second switch (for example, N channel MOS FET) SW12, a pull-up resistance R4, and a third switch (for example, N channel MOS FET) SW13. The third resistance R3 is connected between the first resistance RI and the detection node A in series with the first resistance R1. The second switch SW12 is serially connected between the node B of the first resistance R1 and the third resistance R3 and the input terminal of the detection circuit 21. The pull-up resistance R4 and the third switch SW13 are, for example, serially connected between the output voltage Vo and the ground potential in order to perform the on-off control of the second switch SW12. The control terminal of the second switch SW12 is connected to the node of the pull-up resistance R4 and the third switch SW13, and the control terminal of the third switch SW13 is connected to the node B of the third resistance R3 and the first resistance P1.

The detection circuit 21 is, for example, an analog comparator for comparing the detection voltage Vdet and the threshold voltage Vth, or the like. In addition, for example, a circuit for performing various detection operations to the detection voltage Vdet, such as an AD converter to convert the detection voltage Vdet into digital data, may be applied, and a voltage buffer may be provided at the input stage of the detection circuit 21. Moreover, the parasitic capacitance Ca is generated at the input terminal of the detection circuit 21 owing to, for example, the gate capacitance of a MOS FET constituting the circuit at the input stage of the detection circuit 21, and the like.

Moreover, the second switch SW12 is made of a middle-voltage withstanding element and the detection circuit 21 is made of a low-voltage withstanding element among the constituting elements of the voltage detecting circuit 13. For example, if the switching power source apparatus 1 is the one for 30 V output, then the second switch SW12 can be constituted to have a withstanding voltage of about 30 V, and the detection circuit 21 can be constituted to have a withstanding voltage of about 6 V.

Moreover, each of the resistance values of the first to third resistances R1-R3 constituting the voltage detecting circuit 13 can be selected to suitable values in consideration of the maximum value of a voltage Vds2 to be applied to the detection node A and the withstanding voltages of the second switch SW12 and the detection circuit 21. Since the element of the second switch SW12 is the one having a middle withstanding voltage here, the third resistance R3 can be selected to the one having a smaller resistance value than those of the first and second resistances R1 and R2. Moreover, the resistance values of the first and second resistances R1 and R2 can be selected to be suitable ones lest the detection voltage Vdet should exceed the withstanding voltage of the detection circuit 21 during the period in which the voltage Vds2 takes the high voltage.

Next, the operation of the switching power source apparatus 1 configured as described above will be described FIGS. 2A-2E are time charts showing the voltage waveform at each node of the circuit of FIG. 1.

Figure 2:
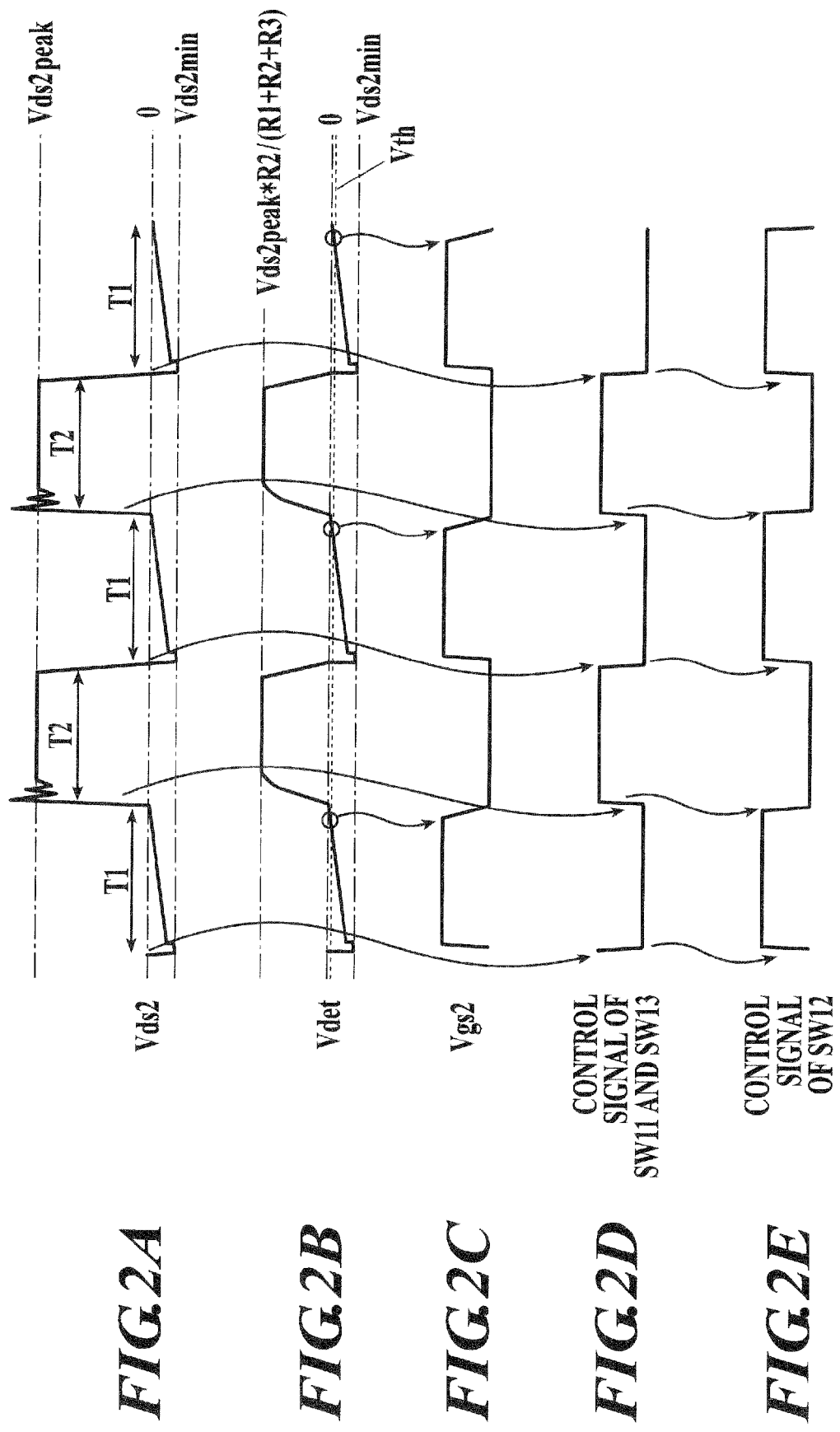
FIGS. 2A, 2B, 2C, 2D, and 2E are waveform diagrams showing the voltage changes at each of the nodes of the circuit of FIG. 1.

The primary side control circuit 11 performs the on-off operation of the switching element SW1 by driving the control voltage Vgs1 of the switching element SW1 to the high level or the low level on the basis of the detection of the output voltage Vo and the like. Since an electric current flows or stops through the primary winding N1 of the transformer T11 by an on-off operation of the switching element SW1, the voltage Vds2, which changes on a large scale as shown in FIG. 2A, is applied to the detection node A in association with such an operation on the primary side and the control operation of the synchronously rectifying element SW2 accompanying the operation on the primary side.

That is, since the voltage Vds2 at the detection node A is the voltage for the voltage drop at the time when the rectified electric current on the secondary side passes through the synchronously rectifying element SW2 in a period T1 in which the switching element SW1 on the primary side is off, the voltage level is low, and voltage changes are small. The potential difference of minimum voltage Vds2min at this time from the ground potential as a standard is not so large.

On the other hand, the voltage composed of the output voltage Vo and the added voltage of the turn ratio 1/N of the input voltage Vin is applied to the detection node A in a period T2, in which the switching element SW1 is on, the voltage Vds2 at the detection node A becomes a high voltage. The potential difference of the maximum voltage Vds2peak from the ground potential as the standard at this time becomes very large.

In the voltage detecting circuit 13, in association with the change of the voltage Vds2 at the detection node A, the on-off states of the first to third switches SW11-SW13 are switched to be changed in two states. That is, in the first state, the first switch SW11 is on, and the second switch SW12 is off (third switch SW13 is on), and a minute electric current flows through the third resistance R3, the first resistance R1, the second resistance R2, and the first switch SW11 by the voltage Vds2 at the detection node A. The voltage subjected to the voltage division by the aforesaid components is introduced from the node C to the detection circuit 21 as the detection voltage Vdet.

Such a first state is caused by the rise of the voltage Vds2 at the detection node A up to a high voltage equal to or more than a certain voltage, as shown in FIGS. 2A-2E. That is, when the voltage Vds2 at the detection node A rises, then the voltage at the node B also rises. Consequently, the first and third switches SW11 and SW13, which receive the input of the voltage at their gate terminals, are turned on. Furthermore, by the turning-on of the third switch SW13, the voltage at the gate terminal of the second switch SW12 changes to the low level, and then the second switch SW12 is turned off. Thereby, the voltage detecting circuit 13 becomes the first state, and the voltage Vds2 at the detection node A is subjected to voltage division to be the detection voltage Vdet and is input into the detection circuit 21.

As shown in FIGS. 2A and 2B, in the period T2, in which the voltage Vds2 at the detection node A becomes the high voltage Vds2peak, it can be known that the detection voltage Vdet input into the detection circuit 21 is dropped to a voltage "V$\alpha$s2peak×R2/(R1+R2+R3)," which is subjected to the voltage division by the first to third resistances R1-R3 ("R1-R3" denotes the resistance values of the first to third resistances R1-R3, respectively).

The second state is the state in which: the first switch SW11 is off, and the second switch SW12 is on (the third switch SW13 is off), so that the voltage Vds2 at the detection node A is input into the detection circuit 21 through the third resistance R3 and the second switch SW12 as it is as the detection voltage Vdet.

Such a second state is caused by the falling of the voltage Vds2 at the detection node A up into the vicinity of the ground potential as shown in FIGS. 2A-2E That is, when the voltage Vds2 at the detection node A falls into the vicinity of the ground potential, then the voltages at the nodes C and B also fall, and the first and third switches SW11 and SW13, which receive the voltages at their gate terminals, respectively, are turned off. Furthermore, by the turning-off of the third switch SW13, the voltage at the gate terminal of the second switch SW12 changes to the high level, and the second switch SW12 is turned on. Thereby, the voltage detecting circuit 13 becomes the second state, and the low voltage at the detection node A is input into the detection circuit 21 through the third resistance R3 and the second switch SW12 as it is as the detection voltage Vdet.

As shown in FIGS. 2A and 2B, in the period T1 when the voltage Vds2 at the detection node A changes to the low voltage, it can be known that the detection voltage Vdet input into the detection circuit 21 is not subjected to the voltage division to be the equal voltage to the voltage Vds2.

Then, in the period T1 when the voltage Vds2 at the detection node A becomes the low voltage, the comparison of, for example, the detection voltage Vdet with the threshold voltage Vth is performed by the detection circuit 21; the timing at which the detection voltage Vdet, which is not subjected to the voltage division and includes a certain degree of generated voltage changes, exceeds the threshold voltage Vth is detected with relatively high accuracy; and the control of turning off the synchronously rectifying element SW2 is executed by the control circuit 14 on the basis of the detected output. Moreover, similarly, the timing when the voltage Vds2 at the detection node A becomes lower than the threshold voltage Vth is detected by the voltage detecting circuit 13, or the control of turning on the synchronously rectifying element SW2 is executed by the control circuit 14 on the basis of the detected output from another detection circuit. By such control, a rectification operation synchronized with that on the primary side is performed by the switching power source apparatus 1, and the highly efficient voltage output can be realized.

As described above, according to the switching power source apparatus 1 and the voltage detecting circuit 13 of the present embodiment, even if the voltage vds2, which changes in a wide range, is applied to the detection node A, the voltage Vds2 is dropped by the resistance division to be introduced into the detection circuit 21 in a high voltage period, and the voltage Vds2 is directly introduced to the detection circuit 21 in a low voltage period. Consequently, the constituting elements of the detection circuit 21 can be made to those having low withstanding voltages, and the voltage changes of the detection voltage Vdet are not contracted in a low voltage range. Thereby high accuracy voltage detection is enabled.

Moreover, when the voltage Vds2 at the detection node A is directly input into the detection circuit 21, a time constant circuit composed of the third resistance R3 and the parasitic capacitance Ca is formed between the detection node A and the input terminal of the detection circuit 21. However, since the third resistance R3 can be selected to have a somewhat small resistance value, the time constant of the time constant circuit can be made to be negligibly small. Thereby, the waveform rounding of the detection voltage Vdet becomes small, and the delay of the detection timing of the predetermined voltage point can be made to be small. The third resistance R3 can be made to be a small resistance by configuring the second switch SW12 with a middle voltage element.

Moreover, since the first to third switches SW11-SW13 of the voltage detecting circuit 13 are configured to be automatically turned on and off according to the changes of the voltage Vds2 at the detection node A, no erroneous operations such as inputting a high voltage into the detection circuit 21 as it is under erroneous control are caused. Moreover, the present embodiment can achieve the decrease of the number of parts and the simplification of the circuit configuration in comparison with the configuration equipped with another controlling circuit for controlling the first to third switches SW11-SW13.

Second Embodiment

Figure 3:
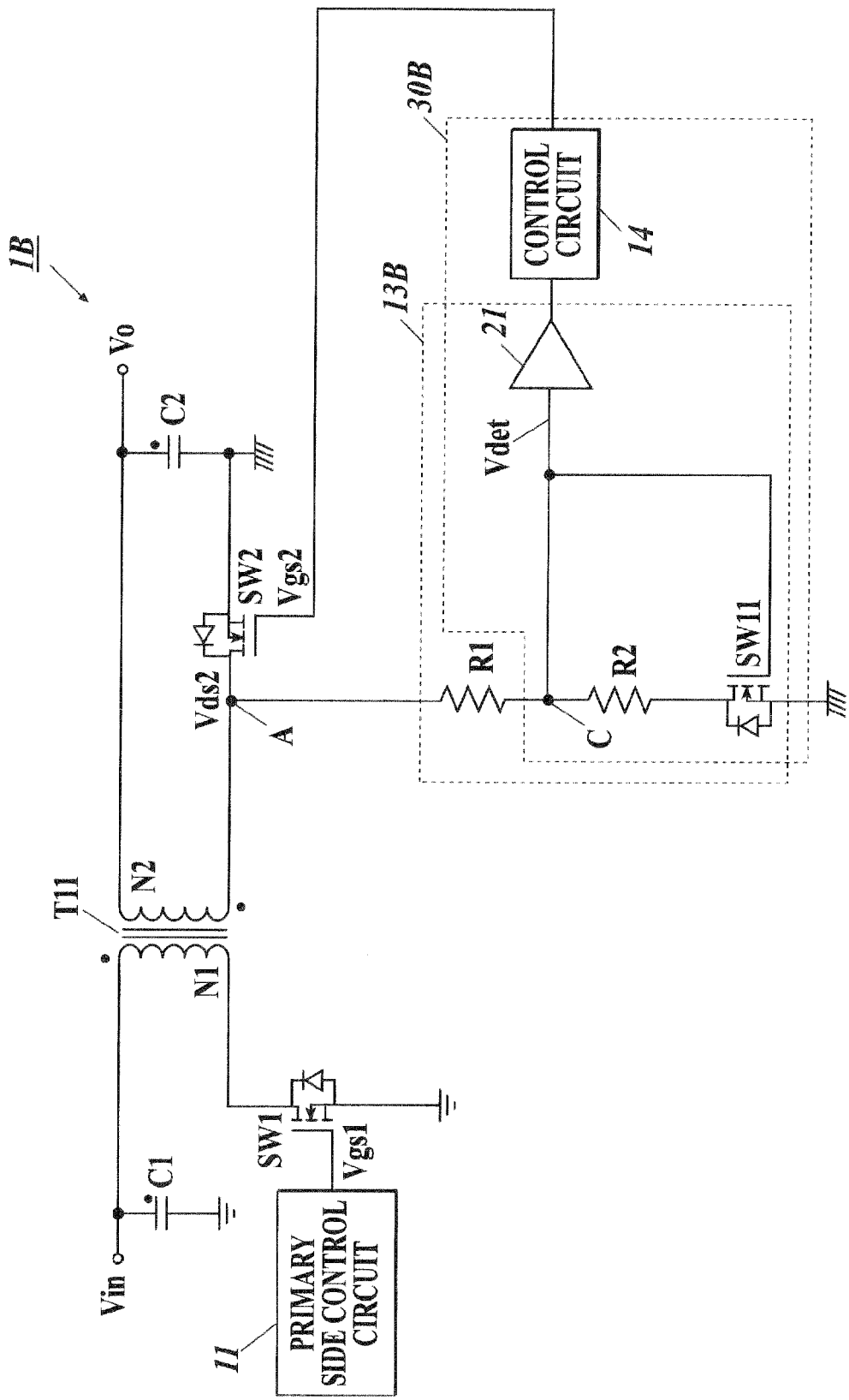
FIG. 3 is a configuration diagram of a switching power source apparatus according to a second embodiment of the present invention.
Figure 4:
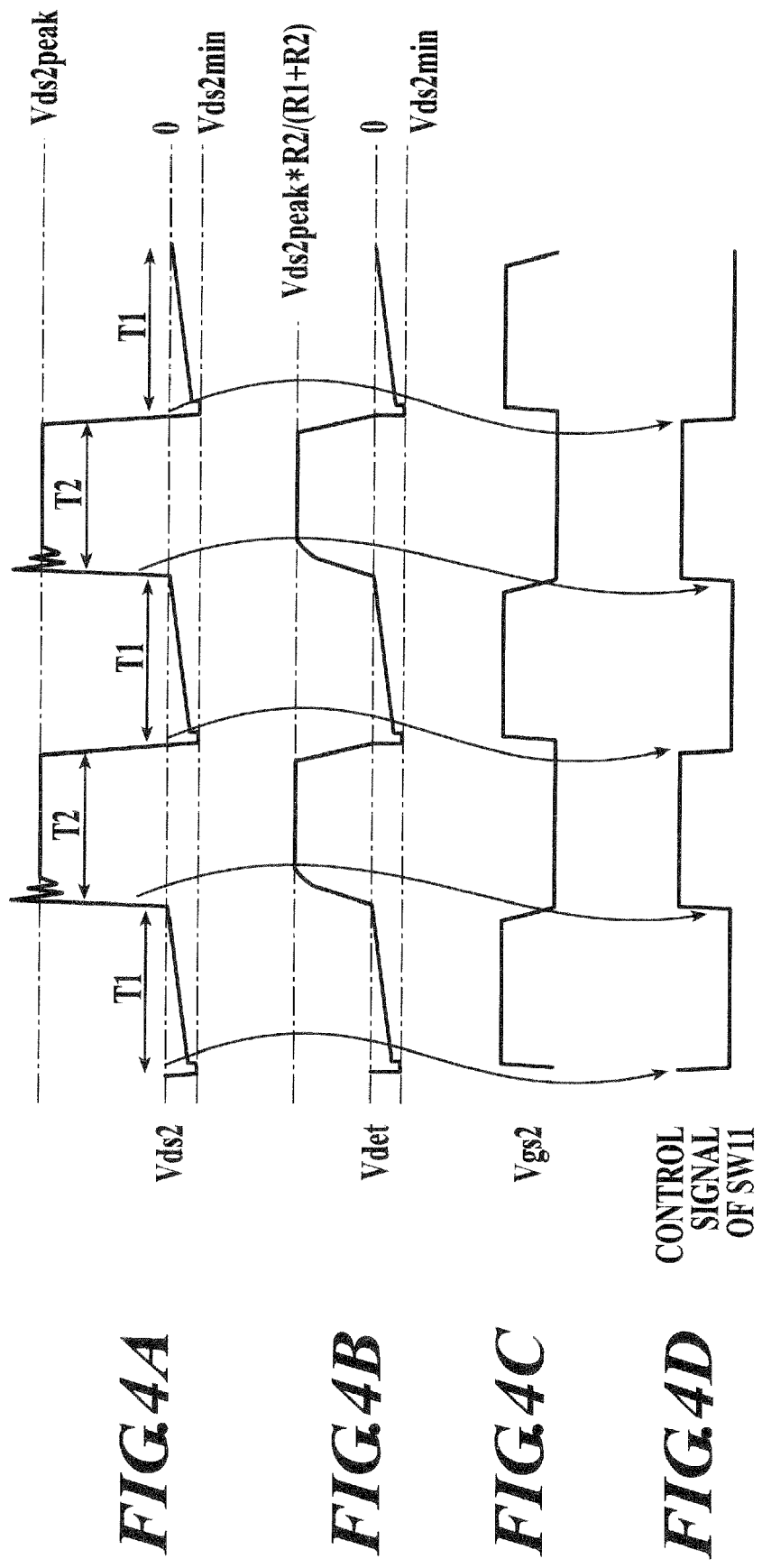
FIGS. 4A, 4B, 4C, and 4D are waveform diagrams showing the voltage changes at each of the nodes of the circuit of FIG. 3.

FIG. 3 shows the configuration diagram of the switching power source apparatus of a second embodiment of the present invention, and FIG. 4 shows a time chart showing voltage changes at each of the nodes of the circuit of FIG. 3.

The switching power source apparatus 1B of the second embodiment includes a voltage detecting circuit 13B having the configuration obtained by simplifying that of the first embodiment. That is, the voltage detecting circuit 13B of the second embodiment is composed of the first resistance R1, the second resistance R2, the first switch SW11, and the detection circuit 21. The first resistance R1, the second resistance R2, and the first switch SW11 are serially connected between the detection node A and the ground potential in order. The detection circuit 21 receives the input of the detection voltage Vdet output to the node C of the first resistance R1 and the second resistance R2 to perform a detection operation. Moreover, the first resistance R1 is connected as the external resistance of a controlling IC 30B among the components.

Also in such a configuration, as shown in FIGS. 4A-4D, by a drop of the voltage Vds2 at the detection node A to the vicinity of the ground potential, the voltage at the node C falls to turn off the first switch SW11. On the other hand, by a rise of the voltage Vds2 at the detection node A to be equal to or more than a certain voltage, the voltage at the node C rises to turn on the first switch SW11 Then, in a period T1 in which the voltage Vds2 at the detection node A is within a low range, the first switch SW11 is turned off, and the voltage Vds2 is not subjected to any voltage division to be input into the detection circuit 21 as it is as the detection voltage Vdet. On the other hand, in a period T2 in which the voltage Vds2 at the detection node A becomes a high voltage, the first switch SW11 is turned on, and thereby the voltage Vds2 is subjected to the voltage division by the resistances R1 and R2 to be input into the detection circuit 21.

Consequently, according to the switching power source apparatus 1B and the voltage detecting circuit 13B thereof, even if the voltage Vds2, which changes to a high voltage and a low voltage, is applied to the detection node A, the constituting elements of the detection circuit 21 can be made to be low withstanding voltage ones, and the advantage that high accuracy voltage detection becomes enabled without no contraction of the voltage changes of the detection voltage Vdet input into the detection circuit 21 can be obtained in a low voltage range.

Incidentally, by the configuration of not including the third resistance R3 and the second switch SW12 unlike the voltage detecting circuit 13 of the first embodiment, the detection voltage Vdet is input into the detection circuit 21 after passing through the first resistance R1 including a relatively large resistance value at the time when the voltage Vds2 at the detection node A is directly introduced into the detection circuit 21. Consequently, if the input terminal of the detection circuit 21 includes parasitic capacitance, a time constant circuit having a somewhat larger time constant in comparison with that of the first embodiment is formed to generate the waveform rounding of the detection voltage Vdet. However, since the constituting elements of the detection circuit 21 can be made to be ones having low withstanding voltages, the constituting elements of the detection circuit 21 can be formed to be smaller in size to reduce the parasitic capacitance, and thereby the time constant can be made to be smaller to reduce the degree of the waveform rounding.

Third Embodiment

Figure 5:
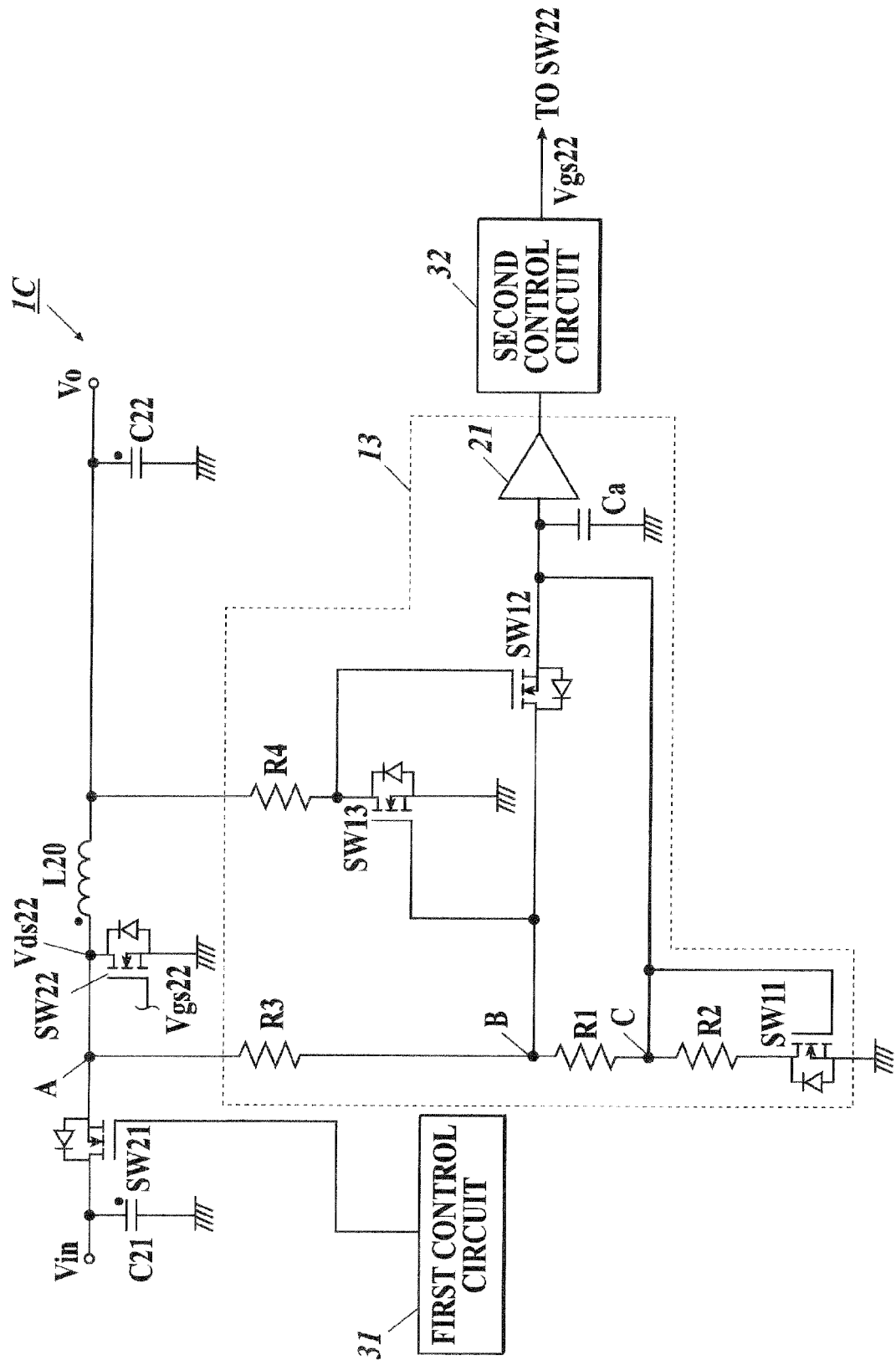
FIG. 5 is a configuration diagram of a switching power source apparatus according to a third embodiment of the present invention.
Figure 6:
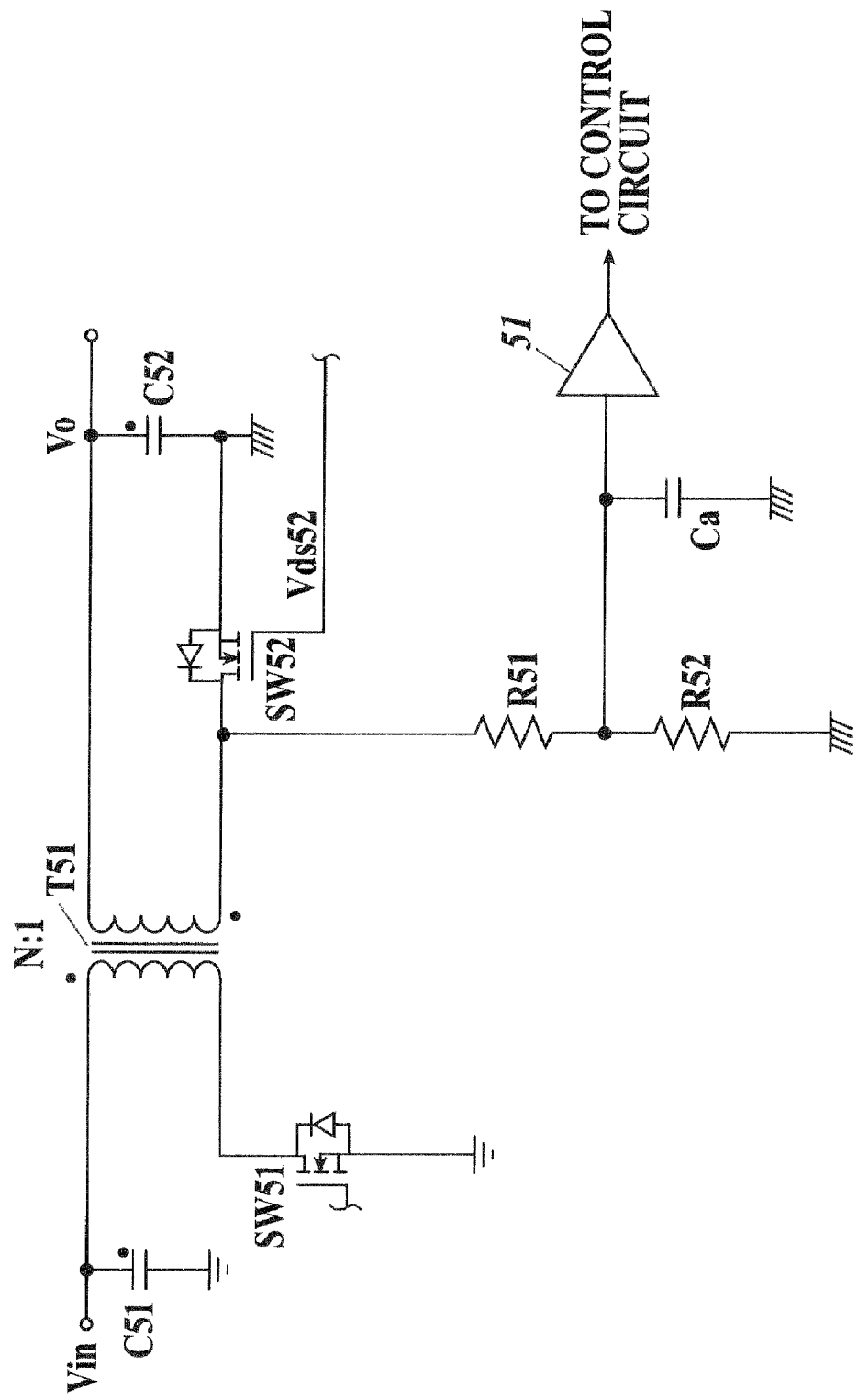
FIG. 6 is a configuration diagram showing an example of a switching power source apparatus to which a conventional detection circuit is applied.

FIG. 5 shows the configuration diagram of the switching power source apparatus of a third embodiment of the present invention.

The switching power source apparatus 1C of the third embodiment adopts the same voltage detecting circuit 13 as that of the first embodiment in order to perform the control of the synchronously rectifying element SW22 in a non-insulated step down type switching power source apparatus 1C.

The switching power source apparatus 1C includes a reactor L20, a first switching element SW21, a first control circuit 31, the smoothing capacitor C21, the synchronously rectifying element SW22, the smoothing capacitor C22, the voltage detecting circuit 13, the second control circuit 32, and the like. The reactor L20 receives the intermittent application of the input voltage Vin to accumulate energy The first switching element SW21 is turned on and off to intermittently apply the input voltage Vin to the reactor L20. The first control circuit 31 performs the on-off control of the first switching element SW21 so that the output voltage Vo may be stabilized. The smoothing capacitor C21 performs the smoothing of the input voltage Vin. The synchronously rectifying element SW22 supplies an electric current from the ground when the first switching element SW21 is off. The smoothing capacitor C22 performs the smoothing of the output voltage from the reactor L20. The voltage detecting circuit 13 introduces the drain voltage Vds22 at the detection node A by setting the drain terminal of the synchronously rectifying element SW22 as the detection node A to perform voltage detection. The second control circuit 32 performs the on-off control of the synchronously rectifying element SW22 on the basis of the output of the voltage detecting circuit 13 and the like.

Even in such a non-insulated step down type switching power source apparatus 1C, a period (on period of the first switching element SW21) in which a relatively large input voltage Vin is applied to the drain terminal of the synchronously rectifying element SW22 and a period (off-period of the first switching element SW21) in which voltage changes are small and low voltages are applied are produced, and a predetermined voltage point is detected to perform the on-off control of the synchronously rectifying element SW22 in the period in which the low voltages are applied between both the period. Consequently, by adopting the voltage detecting circuit 13 to detect the timing at which the drain voltage Vds22 becomes the predetermined voltage, the following advantages can be obtained similarly to the first embodiment: the advantage of enabling the configuration of the detection circuit 21 using low voltage withstanding elements by the voltage division of the voltage at the detection node A, and the advantage of enabling highly accurate voltage detection by inputting the low voltage at the detection node A into the detection circuit 21 directly in a period in which the low voltage having small voltage changes is output to the detection node A, or by reducing the waveform rounding by reducing the time constant in the time constant circuit between the node A and the detection circuit.

Incidentally, the present invention is not limited to the first to third embodiments, but various changes can be performed. For example, although the example of connecting the control terminal of the first switch SW11 of the voltage detecting circuit 13 to the node C of the first resistance R1 and the second resistance R2 is shown in the first to third embodiments, for example, the control terminal of the first switch SW11 may be connected to the node B, or the configuration of providing another similar resistance voltage dividing circuit and performing the voltage division of the voltage of the detection node A to supply the voltage subjected to the voltage division to the control terminal of the first switch SW11 can be adopted.

Moreover, although the configuration of introducing the output voltage Vo to the pull-up resistance R4 and the third switch SW13 to generate the control voltage of the second switch SW12 by the on-off operation of the third switch SW13 in order to alternately turning on and off the second switch SW12 and the first switch SW11 is shown, for example, it is also possible to adopt the configuration in which the second switch SW12 is configured of P channel MOS FET, the voltage at the node B or C is input into the gate terminal of the P channel MOS FET, and the second switch SW12 is made to be turned on and off alternately with the first switch SW11. In addition, the first switch SW11 and the second switch SW12 may be configured to be alternately turned on and off by various configurations.

Moreover, if the voltage at the detection node A does not become so high voltage, then the third resistance R3 can be made to have very small value, or the third resistance P3 can be made to be only the wiring resistance. Moreover, although the example of externally providing the third resistance R3 to the controlling IC 30 is shown in the first embodiment, for example, the second resistance R2, having a large resistance value, may be externally provided and the third resistance R3 may be made to an internal resistance, or the other resistances may be made to be the external elements.

Moreover, although the configuration of applying a plus high voltage to the detection node A is shown in the first to third embodiments, even in the configuration in which a large voltage having an inverted polarity is applied to the detection node A, the voltage detecting circuit 13 of the present invention can be similarly applied In that case, it is possible to deal with the case by suitably changing the constituting element of the voltage detecting circuit 13, for example, changing the N channel MOS FETs of the first to third switches SW11-SW13 to P channel MOS FETs in response to the polarity inversion.

Moreover, although the examples of applying the voltage detection circuits according to the present invention to the detection of the drain voltages of the synchronously rectifying elements with the aim of controlling the synchronously rectifying elements of the flyback system or non-insulated step-down type switching power source apparatus are shown in the embodiments described above, as long as a configuration is the one in which the voltages of a wide range of voltage levels are output to the detection node and a highly accurate voltage detection is needed in a part of the range of the voltage levels, the voltage detecting circuit of the present invention can be effectively applied to such a configuration.

In addition, the circuit configurations and the control methods that have been shown in the embodiments concretely can be suitably changed without departing from the sprit and scope of the present invention.

A first aspect of the present invention is characterized by providing a voltage detecting circuit to perform voltage detection by introducing a voltage from a detection node, comprising:

a first resistance, a second resistance, and a first switching element, connected in series with each other from the detection node to reference electric potential in order; and a detection circuit for performing a detection operation of a voltage by receiving input of the voltage from a node between the first resistance and the second resistance, wherein a control voltage generated on the basis of the voltage at the detection node is supplied to a control terminal of the first switching element, and the first switching element is turned on when the voltage at the detection node is large, and the first switching element is turned off when the voltage at the detection node is small.

A second aspect of the present invention is characterized in that the voltage at the node between the first resistance and the second resistance is input into the control terminal of the first switching element in the voltage detecting circuit of the first aspect.

A third aspect of the present invention is characterized by further comprising:
a third resistance connected between the detection node and the first resistance; and
a second switching element connected between a node between the first resistance and the third resistance and an input terminal of the detection circuit, wherein
the second switching element is turned off when the first switching element is turned on, and the second switching element is turned on when the first switching element is turned off in the voltage detecting circuit of the first aspect or the second aspect A fourth aspect of the present invention is characterized by the voltage detecting circuit further comprising a pull-up resistance and a third switching element connected in series with each other in order between an operation voltage and the reference electric potential, wherein
a control terminal of the third switching element is connected to the node between the first resistance and the third resistance, and
a control terminal of the second switching element is connected to a node between the pull-up resistance and the third switching element.

A fifth aspect of the present invention is characterized by providing a switching power source apparatus of a flyback system, for outputting a voltage to a secondary winding side of a transformer by intermittently applying a voltage to the primary winding of the transformer, comprising:
a transformer including a primary winding and a secondary winding;
a synchronously rectifying element connected to the secondary winding; and
a voltage detecting circuit according to any one of the first to fourth aspects, the voltage detecting circuit performing voltage detection at a connection node between the secondary winding and the synchronously rectifying element, wherein
an operation control of the synchronously rectifying element is performed on the basis of a detected output of the voltage detecting circuit.

A sixth aspect of the present invention is characterized by providing a switching power source apparatus, comprising:
a reactor to accumulate electric power;
a switching element for intermittently applying an input voltage to the reactor;
a synchronously rectifying element for supplying an electric current to the reactor when the switching element is in its offstate; and
a voltage detecting circuit according to any one of the first to fourth aspect, the voltage detecting circuit performing voltage detection at a connection node of the synchronously rectifying element and the reactor, wherein
an operation control of the synchronously rectifying element is performed on the basis of a detected output of the voltage detecting circuit.

According to the present invention, when the voltage at the detection node is large, the first resistance and the second resistance function as the voltage dividing circuit, and the voltage at the detection node is stepped down to be input into the detection circuit On the other hand, when the voltage at the detection node is low, the first switching element is turned off, and the voltage at the detection node is directly input into the detection circuit. Consequently, the elements of the detection circuit can be formed of the ones of middle withstanding voltages and low withstanding voltages in comparison with those of the configuration in which the voltage at the detection node is always directly input into the detection circuit Moreover, if the voltage at the detection node is low, the voltage at the detection node is directly input into the detection circuit, and consequently it is possible to perform the detection processing of the voltage at high accuracy even if the detection point of the voltage exists within a low voltage range.

Furthermore, according to the configuration provided with the third resistance and the second switching element, in the case where the first switching element is turned off and the voltage at the detection node is directly detected, the detection voltage passes through a time constant circuit in which not the first resistance but the third resistance and the parasitic capacity of the detection circuit are coupled with each other. Consequently, the waveform rounding of the detection voltage cause by the time constant circuit can be reduced, and thereby the delay quantity of the detection timing of the voltage can be made to be small to achieve the improvement of the detection accuracy.

That is, at the time of performing the voltage division of the voltage at the detection node, a necessary voltage drop can be obtained by selecting the resistance values of the first resistance and the second resistance, and consequently the resistance value of the third resistance can be made to be small. Consequently, the time constant circuit composed of the third resistance and the parasitic capacitance coupled to the third resistance has a smaller time constant than that of the case of the time constant circuit composed of the first resistance and the parasitic capacitance coupled with the first resistance, and the waveform rounding of the detection voltage becomes smaller.

The entire disclosure of Japanese Patent Applications No. 2008-125440 filed on May 13, 2008 including specifications, claims, drawings and summaries are incorporated herein by reference in their entirety.

What is claimed is:

1. A voltage detecting circuit to perform voltage detection by introducing a voltage from a detection node, comprising:
a first resistance, a second resistance, and a first switching element, connected in series with each other from the detection node to reference electric potential in order; and
a detection circuit for performing a detection operation of a voltage by receiving input of the voltage from a node between the first resistance and the second resistance, wherein
a control voltage generated on the basis of the voltage at the detection node is supplied to a control terminal of the first switching element, and
the first switching element is turned on when the voltage at the detection node is large, and the first switching element is turned off when the voltage at the detection node is small.

2. The voltage detecting circuit according to claim 1, wherein the voltage at the node between the first resistance and the second resistance is input into the control terminal of the first switching element.

3. The voltage detecting circuit according to claim 1, further comprising:
a third resistance connected between the detection node and the first resistance; and
a second switching element connected between a node between the first resistance and the third resistance and an input terminal of the detection circuit, wherein the second switching element is turned off when the first switching element is turned on, and the second switching element is turned on when the first switching element is turned off.

4. The voltage detecting circuit according to claim 3, further comprising a pull-up resistance and a third switching element connected in series with each other in order between an operation voltage and the reference electric potential, wherein
a control terminal of the third switching element is connected to the node between the first resistance and the third resistance, and
a control terminal of the second switching element is connected to a node between the pull-up resistance and the third switching element.

5. A switching power source apparatus of a flyback system for outputting a voltage to a secondary winding side of a transformer by intermittently applying a voltage to the primary winding of the transformer, comprising:
a transformer including a primary winding and a secondary winding;
a synchronously rectifying element connected to the secondary winding; and
a voltage detecting circuit according to claim 1, the voltage detecting circuit performing voltage detection at a connection node between the secondary winding and the synchronously rectifying element, wherein
an operation control of the synchronously rectifying element is performed on the basis of a detected output of the voltage detecting circuit.

6. A switching power source apparatus of a flyback system, for outputting a voltage to a secondary winding side of a transformer by intermittently applying a voltage to the primary winding of the transformer, comprising:
a transformer including a primary winding and a secondary winding;
a synchronously rectifying element connected to the secondary winding; and
a voltage detecting circuit according to claim 2, the voltage detecting circuit performing voltage detection at a connection node between the secondary winding and the synchronously rectifying element, wherein
an operation control of the synchronously rectifying element is performed on the basis of a detected output of the voltage detecting circuit.

7. A switching power source apparatus of a flyback system, for outputting a voltage to a secondary winding side of a transformer by intermittently applying a voltage to the primary winding of the transformer, comprising:
a transformer including a primary winding and a secondary winding;
a synchronously rectifying element connected to the secondary winding; and
a voltage detecting circuit according to claim 3, the voltage detecting circuit performing voltage detection at a connection node between the secondary winding and the synchronously rectifying element, wherein
an operation control of the synchronously rectifying element is performed on the basis of a detected output of the voltage detecting circuit.

8. A switching power source apparatus of a flyback system, for outputting a voltage to a secondary winding side of a transformer by intermittently applying a voltage to the primary winding of the transformer, comprising:
a transformer including a primary winding and a secondary winding;
a synchronously rectifying element connected to the secondary winding; and
a voltage detecting circuit according to claim 4, the voltage detecting circuit performing voltage detection at a connection node between the secondary winding and the synchronously rectifying element, wherein
an operation control of the synchronously rectifying element is performed on the basis of a detected output of the voltage detecting circuit.

9. A switching power source apparatus, comprising:
a reactor to accumulate electric power;
a switching element for intermittently applying an input voltage to the reactor;
a synchronously rectifying element for supplying an electric current to the reactor when the switching element is in its off-state; and
a voltage detecting circuit according to claim 1, the voltage detecting circuit performing voltage detection at a connection node of the synchronously rectifying element and the reactor, wherein
an operation control of the synchronously rectifying element is performed on the basis of a detected output of the voltage detecting circuit.

10. A switching power source apparatus, comprising:
a reactor to accumulate electric power;
a switching element for intermittently applying an input voltage to the reactor;
a synchronously rectifying element for supplying an electric current to the reactor when the switching element is in its off-state; and
a voltage detecting circuit according to claim 2, the voltage detecting circuit performing voltage detection at a connection node of the synchronously rectifying element and the reactor, wherein
an operation control of the synchronously rectifying element is performed on the basis of a detected output of the voltage detecting circuit.

11. A switching power source apparatus, comprising:
a reactor to accumulate electric power;
a switching element for intermittently applying an input voltage to the reactor;
a synchronously rectifying element for supplying an electric current to the reactor when the switching element is in its off-state; and
a voltage detecting circuit according to claim 3, the voltage detecting circuit performing voltage detection at a connection node of the synchronously rectifying element and the reactor, wherein
an operation control of the synchronously rectifying element is performed on the basis of a detected output of the voltage detecting circuit.

12. A switching power source apparatus, comprising:
a reactor to accumulate electric power;
a switching element for intermittently applying an input voltage to the reactor;
a synchronously rectifying element for supplying an electric current to the reactor when the switching element is in its off-state; and
a voltage detecting circuit according to claim 4, the voltage detecting circuit performing voltage detection at a connection node of the synchronously rectifying element and the reactor, wherein
an operation control of the synchronously rectifying element is performed on the basis of a detected output of the voltage detecting circuit.

* * * * *